PROCESS FOR STRIPPING ADHESIVE FROM A METAL BASE

Filed Nov. 15, 1962

INVENTORS
HERBERT JOSEPH PINE,
CHARLES WALTER SMITH,
BY
Luther A. Marsh
AGENT

United States Patent Office 3,282,765

Patented Nov. 1, 1966

3,282,765

PROCESS FOR STRIPPING ADHESIVE FROM A METAL BASE

Herbert Joseph Pine, Fords, and Charles Walter Smith, Red Bank, N.J., assignors to E. I. du Pont de Nemours and Company, Wilmington, Del., a corporation of Delaware Filed Nov. 15, 1962, Ser. No. 237,995
2 Claims. (Cl. 156—344)

This invention relates to a new and useful process for the recovery of a metal plate used for the support of polymerizable strata. More particularly, it relates to a new and useful process for the recovery of the metal plate from a photopolymerizable printing plate and relief printing plate made therefrom.

In the manufacture of photopolymerizable printing plates of the type described in Smith, U.S. Patent 3,012,952 and Martin et al., U.S. Patent 2,927,022, the metal support may represent a substantial part of the total cost of the element. Therefore, it is of considerable economic importance to recover the metal support from elements which have either served their useful life as printing plates or which have been found to be defective at some stage of their manufacture or use. None of the methods of recovery known in the art has proven entirely satisfactory, particularly in avoiding damage to the metal or in removing the adhering strata in a single sheet. Breaking up of the adhering strata into small pieces is especially objectionable in recovery systems using solvents since it causes rapid deterioration of the solvent.

An object of the present invention is to provide a practical and dependable process for recovering a metal support from a composite element comprising a stratum adhered to said support. Another object is to remove the stratum as a single sheet rather than in small pieces. Still another object is to provide a simple and rapid process for recovery of the metal support in an undamaged form. Other objects and advantages of the invention will be apparent from the following description when read in connection with the accompanying drawing in which.

These and other objects are accomplished by the novel process of this invention. This invention comprises a process for the recovery of a metal supporting sheet from an adherent polymerizable stratum which comprises polymerizing said stratum and then separating said stratum in one piece from said metal supporting plate.

Figure 1:
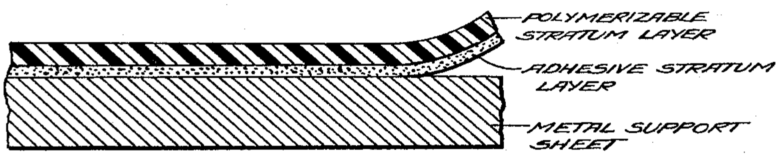
FIGURE 1 shows in enlarged cross-section the photopolymerizable and adhesive stratum on a metal support with a portion partially removed.
Figure 2:
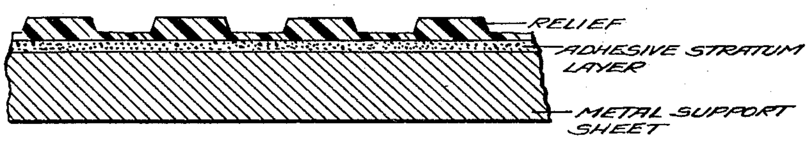
FIGURE 2 shows in enlarged cross-section a printing relief stratum and an adhesive stratum and the metal support.

In a preferred embodiment of this invention, a printing plate comprising a photopolymerized stratum bonded by an adhesive stratum to a metal support, as described in Example V of U.S. Patent 3,036,913 and as illustrated in FIGURES 1 and 2 of this case, is treated to recover the metal support. This treatment comprises exposing the photopolymerizable stratum to actinic radiation followed by heating of the plate and then mechanically stripping the strata from the metal support. The amount of exposure to actinic, radiation can vary from about 4-watt seconds/sq. in. to about 17.5-watt seconds/sq. in. The preferred amount of exposure will vary depending upon the thickness of the polymerizable stratum and the force required to strip the stratum from the plate. Greater exposure to actinic radiation further increases the operable maximum treating temperature and the time of heating. It also gives the stratum greater mechanical strength thereby yielding a cleaner separation from the metal support. The temperature of heating the plate following the actinic irradiation can vary over a wide range. As the temperature becomes higher, the adhesive bond weakens so that less mechanical force is required to cause separation. The range of temperature will vary depending upon the thickness of the strata and the degree of exposure to actinic radiation.

This preferred embodiment is equally effective in recovering a metal support from partially fabricated printing plates, where only the adhesive stratum has been applied to the metal support. Defects are discovered at this stage of manufacture, in some instances, and it is, therefore, desirable to recover the metal support from such adhesive stratum without first applying the photopolymerizable stratum.

In another embodiment of this invention, a printing plate comprising a photopolymerizable stratum bonded by an adhesive stratum to a metal support, as described in Example V of U.S. Patent 3,036,913 and as illustrated in FIGURES 1 and 2 of this case, is treated to recover the metal support. The treatment comprises heating the element to a temperature of from at least about 110° F. to about 290° F. and preferably from about 170° F. to about 250° F. for from about 20 seconds up to about 10 minutes and then stripping the coatings from the metal support. The heating can consist of heating the plate by soaking in hot water, by placing in an oven or by placing upon a hot plate.

This invention will be further illustrated but is not intended to be limited by the following examples, in addition to the examples appearing above, wherein the parts and percentages stated are by weight unless otherwise indicated.

EXAMPLE 1

A number of 6-inch by 6-inch photopolymerizable printing plates, each comprising a photopolymerizable stratum bonded by an adhesive stratum to a metal support, are prepared as described in Example V of U.S. Patent 3,012,952 except that the supporting sheets of aluminum are 103 mils in thickness.

The plates are fitted with copper-constantan thermocouples arranged to record the temperatures at the interface of the metal support and the adhesive stratum. The plates are placed on a conventional hot plate (metal support contacting the heating element), adjusted so that after about 10 minutes the thermocouples will register a fairly constant temperature of 160° F. One of the plates, after only 1 minute of heating, has an interface temperature of 115° F. but the adhesive bond is not sufficiently weakened by the 1 minute treatment to permit mechanical separation of the adhering strata from the metal support without tearing said strata. Other plates are heated in this manner for varying times up to as much as 11 minutes but in all cases there is tearing of the adhering strata during the attempted mechanical removal of the strata. With a 16-minute treatment at the same adjustment of the hot plate, satisfactory stripping is obtained. Other plates, with higher temperature adjustments of the hot plate heating element, are subjected to varying combinations of time and temperature of treatment as shown in Table I:

*Table I*

| Heating Time, Minutes | Interface Temperature, ° F. | Mechanical Stripping Results |
|---|---|---|
| 11 | 160 | Unsatisfactory, stratum tears. |
| 16 | 160 | Stratum easily removed in one piece. |
| ½ | 170 | Do. |
| ¼ to ½ | 290 | Do. |

EXAMPLE 2

Photopolymerizable printing plates prepared in Example 1 are exposed by a movable 1800-watt high pressure mercury arc which passes over the plate 10 times at a distance of 1¼ inches for a total exposure of 17.5-watt seconds/sq. in. of actinic radiation.

The plates are fitted with thermocouples to indicate the interface temperatures as in Example 1 and are placed on a hot plate, preheated to 450° F., with the metal support contacting the heating element. The plates are allowed to remain on the hot plate for various lengths of time and said lengths of time, interface temperatures and results are recorded as shown in Table II:

*Table II*

| Length of Time on Hot Plate | Interface Temperature, ° F. | Mechanical Stripping Results |
|---|---|---|
| 15 seconds | 250 | Strips but requires great force. |
| 30 seconds | 265 | Moderate force required. |
| 40 seconds | 270 | Do. |
| 45 seconds | 275 | Do. |
| 90 seconds | 320 | Strips very easily. |

Another plate is heated in a similar manner but allowed to remain on the hot plate for 5 minutes at which time it has attained an interface temperature of 360° F. Fumes are first detected after 2 minutes heating when the temperature has reached 340° F. They continue to increase somewhat as heating is continued throughout the 5-minute treatment period. At the end of the treatment period, there is practically no adhesion so the polymerizable stratum is merely lifted off of the metal support. Thus, from each of the printing plates described in this example, a clean support is recovered in satisfactory condition for reuse in the manufacture of another printing plate.

EXAMPLE 3

Another printing plate as prepared in Example 1 is exposed to a line process negative and washed out as described in Example V of U.S. Patent 3,012,952. After being thoroughly dried, it is heated on a hot plate as described above for 1 minute to an intereface temperature of 300° F. The adherent strata are mechanically stripped off intact to effect satisfactory recovery of the metal support. In this case, the exposure through the line process negative causes sufficient polymerization to give appreciable strengthening of the photopolymerizable stratum.

EXAMPLE 4

Several 18- by 24-inch photopolymerizable printing plates are prepared as in Example 1 of U.S. Patent 3,012,952, using supporting sheets of steel which are 12 mils in thickness. Three of these plates are immersed in hot water (170° F.) for various lengths of time, viz., 2 minutes, 4 minutes and 5 minutes. All three can be mechanically stripped apart to yield the recovered metal support but, with the 2-minute treatment, considerable mechanical force is required. With the 4-minute treatment, stripping is much easier. With the 5-minute treatment, stripping can be carried out with very little force. There is no advantage to be gained in extending the treatment time beyond 5 minutes.

EXAMPLE 5

Photopolymerizable printing plates prepared as in Example 1 are recovered (without exposure to actinic radiation) by heating in hot water to soften the adhesive bond. Immediately after removal from the hot water bath, the lightly adhering strata are mechanically stripped away to leave a reusable aluminum support. Treatment in water at 120° F. for 30 seconds causes a weakening of the adhesive bond but mechanical stripping is difficult. Satisfactory stripping is achieved when the treatment is extended to 40 seconds. Very good results are obtained with other plates which are treated at higher water temperatures and for longer times including 45 seconds at 180° F., 6 minutes at 150° F. and 10 minutes at 160° F. As the treatment time and temperature increase, the force necessary to cause mechanical stripping decreases. Best results are obtained at temperatures between 130° F. and 190° F. with a treatment time of at least 1 minute. No beneficial results can be seen in extending the treatment time beyond about 20 minutes.

EXAMPLE 6

The procedure disclosed in Example V of U.S. Patent 3,036,913 is repeated for a number of plates, through the steps of preparing the "bonderized" steel support and applying the 15-mil thick stratum of adhesive (which dries to a thickness of 3 mils). No photopolymerizable upper stratum is applied.

The plates are heated for various times on a hot plate with the metal support being in contact with the heating device and using a thermocouple embedded in the adhesive layer to indicate the temperature at the metal-adhesive stratum interface at the end of the heating period. The plates are subsequently bathed in trichloroethylene at room temperature for 5 minutes with the experimental results being tabulated below:

*Table III*

| Time | Temperature | Solvent Stripping Results |
|---|---|---|
| Control (no heating) | 72° F. (room temperature) | Unsatisfactory, adhesive layer dissolves in solvent. |
| 5 seconds | 110° F. | Satisfactory, film separates intact in the solvent. |
| 15 seconds | 140° F. | Do. |

EXAMPLE 7

Although the adhesive stratum in the partially fabricated plates prepared in Example 6 contains only a thermal initiator and no photoinitiator, the monomer alone (triethyleneglycol diacrylate) is sufficiently photopolymerizable that on exposure of 8 passes of the high pressure mercury arc, used as described in Example 2, causes a reduction of unpolymerized monomer from the original 15.5% of the total composition to only 1.5% by weight. A plate, polymerized in this manner, is bathed in trichloroethylene for 5 minutes at room temperature and the adhesive stratum separated in the solvent as an intact sheet, leaving a clean, reuseable metal support.

The triethyleneglycol diacrylate monomer in the original adhesive stratum was calculated from the weights of ingredients used in manufacture as being 15.5% by weight of the total dry composition. After exposure, the remaining concentration of unpolymerized monomer is determined analytically by weighing a sample of the carefully dried adhesive stratum (2.4116 g.), dissolving the soluble portion in glacial acetic acid, filtering and discarding the residue, and bringing up to volume (100 ml.) in a volumetric flask. One-fifth of the solution is transferred to a 250-ml. volumetric flask to which is added 10 ml. of a 0.1 N solution of pyridine sulfate dibromide (PSDB) and 5 ml. of mercuric acetate. The flask is kept in the dark for 30 minutes during which time the monomer is brominated at the double bond by reaction with PSDB. Excess KI (3.0 g. dissolved in 85 ml. of $H_2O$) is added to react with unreacted PSDB, forming $KI_3$. The $KI_3$ is then titrated, in the presence of 4 ml. of an aqueous solution of starch serving as an indicator, with an 0.1019 N solution of $Na_2S_2O_3$ until a colorless end point is reached. Since 8.0 ml. of the $Na_2S_2O_3$ solution is required, the concentration of monomer is calculated as being 1.5% by weight of the dry sample of adhesive. This represents about the minimum degree of polymerization required to permit satisfactory recovery of the metal support, with the adhesive stratum separating as a single sheet. With less polymerization, the adhesive sheet will dissolve in the solvent or come off in flakes so as to contaminate the solvent.

EXAMPLE 8

Other partially fabricated plates prepared as described in Example 6 are heated by soaking in hot water for the various times and temperatures as indicated in Table IV below, and then mechanically stripped.

*Table IV*

| Water Temperature, ° F. | Soak Time, Minutes | Mechanical Stripping Results |
|---|---|---|
| 155 | 1½ | Borderline, strips in sections. |
| 150 | 3½ | Good, strips intact. |
| 175 | 1½ | Borderline, strips in sections. |
| 175 | 3 | Good, strips intact. |
| 188 | 3 | Do. |
| 185 | 5 | Do. |
| 185 | 10 | Do. |

EXAMPLE 9

A piece of nainsook is applied over the adhesive stratum of a partially fabricated printing plate prepared as described in Example 6. The adhesive is then thermally polymerized by heating in an oven for 5 minutes at 280° F. Next, the plate is soaked in hot water for 3 minutes at 130° F. The nainsook stripping aid, with the adhering adhesive layer, is then pulled away to leave a clean, reuseable steel support. Other plates are stripped satisfactorily in a similar manner, using water temperatures up to 190° F. Less force is required in carrying out the stripping operation as the time and temperature of the water treatment are increased, although no useful purpose appears to be served in extending the treatment time beyond 20 minutes. Comparable results are obtained when the nainsook stripping aid is replaced with a thin (0.001-inch thick) sheet of polyethylene terephthalate film.

In the above examples, reference has been made to "mechanical stripping" of a stratum from a metal support. This may amount to no more than merely grasping by hand a corner of the stratum and then physically pulling the stratum free from the metal support. Prior to the stripping operation, the adhesive bond will have been weakened by heating while the stratum will have been polymerized to the extent that it may be easily separated, as a single sheet, from the metal support. Various tools can be used to facilitate stripping, e.g., pliers, clamps or other grasping tools, wedges, etc. A particularly useful device is a "key," similar in principle to that used in opening a tin can. In using this device, a corner or edge of the stratum is inserted into a slot in the key which is then turned so as to wrap up the stratum as the tool is rolled along the plate surface, thereby effecting separation of the stratum from the metal support.

The photopolymerizable printing plates from which metal supports are reclaimed according to this invention can be the types described in U.S. Patents 2,923,673; 2,927,022 and 3,012,952. The adhesive stratum layers of these elements, which bond the photopolymerizable stratum to the metal support, can be of the types described in Burg, U.S. Patent 3,036,913.

The metal supports reclaimed according to this invention are generally aluminum or steel but can be made of some other metals, such as magnesium and tin. The metal supports often have received special treatment to give them certain desired properties and uniform thickness. Such treatments increase the cost of the supports and thus make their recovery of particular economic importance. Three types of metal support, specially treated to resist corrosion are described in Burg, U.S. Patent 3,036,913; an "alodized" aluminum sheet in Example 1, a "bonderized" steel sheet in Example 5, and a tin-plated steel sheet in Example 13.

The methods of this invention may be adapted to continuous processes for recovering metal supports, for example, by traversing through an oven or through solvent baths on a conveyor. Likewise, the mechanical stripping may be made a part of the continuous operation by manually separating the leading edges of the polymerizable strata from the metal supports and then feeding the leading edges of these strata and of the supports into different sets of pull rolls. Alternatively, separation might be started by bonding tabs to the leading edges of the strata, or the leading edges might be lifted by means of vacuum rolls prior to feeding the separated edges into separate sets of pull rolls.

Metal supports coated only with an unpolymerized adhesive stratum can also be recovered by treatment with organic solvents at temperatures as low as room temperature, particularly when using chlorinated solvents such as methylene chloride, trichloroethylene, perchloroethylene and chloroform. Acetone and methyl ethyl ketone can also be used. Such recovery, however, is less economical than the more preferred methods since it causes contamination of the solvent because of the breaking up of the adhering stratum. Other recovery methods known in the art have proven entirely unsatisfactory, particularly in avoiding damage to the metal or in removing the adhering strata in a single sheet.

This invention is useful for the recovery and subsequent reuse of a metal plate used for the support of polymerizable strata. It is particularly useful for the recovery and subsequent reuse of a metal plate used for the support of a printing polymerizable stratum.

An advantage of this invention is that it provides a practical and economical method for recovering a metal support in immediately reuseable condition from a printing plate of the type containing polymerizable strata. A further benefit is that such receovery of the metal support can be from either a partial or complete plate. Other advantages are simplicity and rapidity of operation.

While the methods herein described constitute preferred embodiments of the invention, it is to be understood that the invention is not limited to these precise methods, and that changes may be made therein without departing from the scope of the invention which is defined in the appended claims.

What is claimed is:

1. A process for the recovery of a metal support from the contiguous adhesive stratum of an initial photopolymerizable element having an addition polymerizable stratum adherent to the adhesive stratum, (a) said polymerizable stratum comprising a solid photopolymerizable layer comprising a cellulose carboxylic acid ester, an ethylenically unsaturated monomer capable of forming a high polymer by photoinitiated addition polymerization and an addition polymerization initiator activatable by actinic light and thermally inactive at 180° C. and below, and (b) said adhesive stratum consisting of (1) about 75 parts by weight of the copolyester prepared by reacting an excess of ethylene glycol and dimethyl hexahydroterephthalate, dimethyl sebacate and dimethyl terephthalate, the latter reactants in a molar ratio of 8:1:1 respectively, (2) about 2.4 parts by weight of benzoyl peroxide as a thermally sensitive initiator, and (3) about 22.5 parts by weight of triethylene glycol diacrylate containing about 0.1 part by weight of p-methoxyphenol as a thermal polymerization inhibitor, (a) polymerizing said adhesive stratum to the extent that the concentration of the triethylene glycol diacrylate in said stratum is not more than 1.5% by weight on a dry basis, and (b) bathing said element in a chlorinated hydrocarbon solvent and separating the treated adhesive in one piece by stripping it and any layers carried by it from the supporting plate.

2. A process according to claim 1 wherein said solvent is trichloroethylene.

References Cited by the Examiner

UNITED STATES PATENTS

| | | | |
|---|---|---|---|
| 2,723,962 | 11/1955 | Hedges et al. | 156—344 |
| 3,003,413 | 10/1961 | Taylor et al. | 156—344 |

EARL M. BERGERT, *Primary Examiner.*

J. P. MELOCHE, *Assistant Examiner.*